United States Patent
Mogren et al.

(10) Patent No.: US 11,372,028 B2
(45) Date of Patent: Jun. 28, 2022

(54) REMOTE SENSOR ARRANGEMENT

(71) Applicant: Bombardier Transportation GmbH, Berlin (DE)

(72) Inventors: Lars-Ove Mogren, Tyresö (SE); Magnus Fredholm, Lidingö (SE); Gunnar Klinghult, Lund (SE)

(73) Assignee: BOMBARDIER TRANSPORTATION GMBH, Berlin (DE)

( * ) Notice: Subject to any disclaimer, the term of this patent is extended or adjusted under 35 U.S.C. 154(b) by 0 days.

(21) Appl. No.: 17/109,438

(22) Filed: Dec. 2, 2020

(65) Prior Publication Data
US 2021/0165021 A1    Jun. 3, 2021

(30) Foreign Application Priority Data
Dec. 3, 2019    (SE) .................................... 1951382-9

(51) Int. Cl.
*G01R 31/58*    (2020.01)
*G01R 15/20*    (2006.01)
*G01R 19/00*    (2006.01)

(52) U.S. Cl.
CPC ......... *G01R 15/202* (2013.01); *G01R 15/207* (2013.01); *G01R 19/003* (2013.01); *G01R 31/58* (2020.01)

(58) Field of Classification Search
CPC .......................... G01R 15/18–186; G01R 1/22
See application file for complete search history.

(56) References Cited

U.S. PATENT DOCUMENTS

| 4,901,008 | A | 2/1990 | Quastel et al. |
| 6,404,180 | B1 * | 6/2002 | Haensgen ............ G01R 15/202 |
| | | | 324/117 H |
| 6,894,478 | B1 | 5/2005 | Fenske |

(Continued)

FOREIGN PATENT DOCUMENTS

| AU | 2012245653 A1 * | 10/2013 | ............. G01D 4/004 |
| CA | 2533385 A1 * | 7/2006 | ............. G01D 21/00 |

(Continued)

*Primary Examiner* — Patrick Assouad
*Assistant Examiner* — Demetrius R Pretlow
(74) *Attorney, Agent, or Firm* — Renner, Otto, Boisselle & Sklar, LLP

(57) ABSTRACT

Stand-alone remote sensor arrangement for monitoring parameter activity in a cable including a sensor unit, a power source unit, a connecting cable, and a control unit. The sensor unit includes a shielded housing enclosing a toroid-shaped core fixed around the cable to be monitored. The arrangement operates in a low current consumption mode and a measurement mode, in which measurement mode a Hall sensor element senses a predetermined parameter activity of the cable. The sensor unit includes a sensor activation unit arranged and structured to sense parameters related to magnetic field variations in the core caused by parameter activity of the cable, and to generate a sensor activation signal including parameter values dependent on sensed parameters. The control unit receives the signal and evaluates the parameter values in relation to predetermined mode changing criteria, and changes mode of operation of the arrangement dependent on the result of the evaluation.

15 Claims, 2 Drawing Sheets

(56) References Cited

U.S. PATENT DOCUMENTS

| | | | |
|---|---|---|---|
| 6,897,758 B1* | 5/2005 | Baumgaertl | G01R 15/185 336/175 |
| 7,253,602 B2 | 8/2007 | Shvach et al. | |
| 7,936,164 B2* | 5/2011 | Doogue | G01R 15/207 324/117 H |
| 9,244,100 B2* | 1/2016 | Coleman | G01R 1/22 |
| 9,778,285 B2 | 10/2017 | Fox | |
| 9,970,975 B2* | 5/2018 | Bango | G01R 15/186 |
| 10,247,758 B2* | 4/2019 | Milano | G01R 15/202 |
| 10,295,575 B2* | 5/2019 | Cheng | G01R 31/382 |
| 2007/0063689 A1* | 3/2007 | Baker | G01R 15/202 324/76.11 |
| 2012/0182658 A1* | 7/2012 | Motz | G01R 19/0092 361/91.5 |
| 2013/0033260 A1* | 2/2013 | Nomura | G01R 33/0041 324/252 |
| 2013/0063140 A1* | 3/2013 | Nagai | G01R 1/22 324/244 |
| 2014/0028303 A1* | 1/2014 | Ostrogorska | G01R 19/20 324/244 |
| 2014/0266240 A1* | 9/2014 | Haensgen | H02J 50/001 324/537 |
| 2014/0292309 A1* | 10/2014 | Kurashima | G01R 33/0283 324/144 |
| 2016/0002801 A1* | 1/2016 | Grant | C25C 7/06 324/537 |
| 2016/0091535 A1* | 3/2016 | Bannister | G01R 15/125 324/127 |
| 2016/0146856 A1* | 5/2016 | Komiya | G01R 15/26 324/126 |
| 2016/0274153 A1* | 9/2016 | Deokar | H01R 9/00 |
| 2017/0045571 A1* | 2/2017 | Joseph | G01R 15/186 |
| 2018/0238955 A1* | 8/2018 | Bango | G01R 19/02 |
| 2019/0025348 A1* | 1/2019 | Slivnik | G01R 19/00 |
| 2019/0302151 A1* | 10/2019 | Manikandan | G01R 15/181 |
| 2019/0340706 A1* | 11/2019 | Boone | G01R 21/133 |
| 2020/0386789 A1* | 12/2020 | Nakajima | G01R 15/186 |

FOREIGN PATENT DOCUMENTS

| | | | | |
|---|---|---|---|---|
| CN | 108983015 A | * | 12/2018 | |
| CN | 109633233 | | 4/2019 | |
| CN | 209044069 U | * | 6/2019 | |
| CN | 111999541 A | * | 11/2020 | |
| CN | 112816763 A | * | 5/2021 | |
| DE | 10240242 A1 | * | 3/2004 | G01R 15/183 |
| GB | 2546532 A | * | 7/2017 | G01R 15/186 |
| JP | H09166626 A | * | 6/1997 | |
| JP | H09257837 A | * | 10/1997 | |
| JP | 2019144027 A | * | 8/2019 | |
| KR | 20100079288 A | * | 7/2010 | |
| WO | WO-9615460 A1 | * | 5/1996 | G01R 15/205 |
| WO | 2015119789 | | 8/2015 | |
| WO | WO-2017148826 A1 | * | 9/2017 | G01R 15/205 |
| WO | 2019032912 | | 2/2019 | |

* cited by examiner

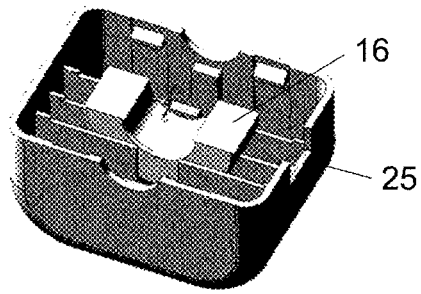
FIG. 4          FIG. 5
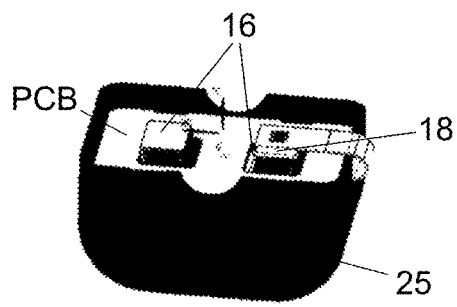
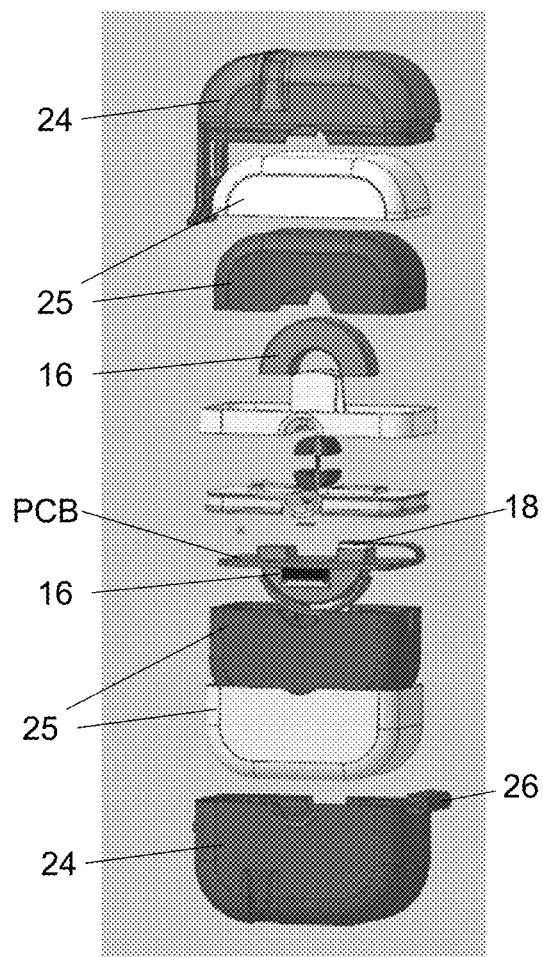
FIG. 6          FIG. 7

REMOTE SENSOR ARRANGEMENT

This application claims priority of Swedish Patent Application No. 1951382-9 filed Dec. 3, 2019, which is hereby incorporated herein by reference.

TECHNICAL FIELD

The present disclosure relates to a remote sensor arrangement, and in particular to a stand-alone arrangement adapted to be applied for sensing activity in cables in any monitoring application and specifically in connection with railway implementations.

BACKGROUND

A so-called Remote Sensor Unit (RSU) is typically used to monitor wayside and trackside objects health and functionality, in particular in relation to railways. The RSU provides monitoring functionality for different types of objects and loads, e.g. wayside objects such as Point Machines (PMs), Barrier Machines (BMs), aspect lights and other objects can be monitored with the RSU.

Depending on the monitored object, different parameters can be tracked. For dynamic loads such as PMs, the RSU can be used to monitor duration of the switch movement but also minimum, maximum, average and RMS current values of the movement. For static loads such as aspect lights, the RSU can be used to track accumulated on-time and operational current levels.

A first generation of RSUs required cabling for measurement and powering.

The object of the present invention is to achieve a robust, stand-alone, Remote Sensor Unit capable of measuring a wider range of AC/DC including low currents the presently applied technology cannot measure. 'Stand-alone' infers that it requires no external energy source and has a wireless communication interface to remote equipment.

SUMMARY

The above-mentioned object is achieved by the present invention according to the independent claim.

Preferred embodiments are set forth in the dependent claims.

According to an aspect of the present invention it relates to a stand-alone remote sensor arrangement 2 for monitoring parameter activity in a cable 4. The arrangement comprises a sensor unit 6 and a power source unit 8 connected to each other by a connecting cable 10, and a control unit 12. The power source unit 8 is configured to supply energy to said sensor unit 6.

The sensor unit 6 comprises a shielded housing 14 enclosing a toroid-shaped core 16 configured to be fixed around the cable 4, via a plastic fastener on the core housing, to be monitored. The toroid-shaped core 16 is provided with at least one gap where a Hall sensor element 18 is arranged. The remote sensor arrangement 2 is configured to be operated in a low current consumption mode and in a measurement mode, in which measurement mode said Hall sensor element 18 is configured to sense a predetermined parameter activity, e.g. flowing current, of said cable 4, and that said control unit 12 is configured to change the mode of operation of said sensor arrangement 2.

The sensor unit 6 further comprises a sensor activation unit 20 arranged and structured to sense parameters related to magnetic field variations in core 16 caused by parameter activity of cable 4, and to generate a sensor activation signal 22 including parameter values dependent on said sensed parameters. The control unit 12 is configured to receive sensor activation signal 22 and to evaluate parameter values in relation to predetermined mode changing criteria, and to change the mode of operation of sensor arrangement 2 dependent on the result of said evaluation.

Thus, the sensor arrangement, according to the present disclosure, relates to an RSU that contains a 'wake-up' mechanism that activates the sensor unit between measurements, which allows significant savings on consumption of the battery. The sensor activation unit (sensing coil) measures a wide range of AC/DC currents including low value currents that the presently applied technology cannot measure.

In one embodiment the remote sensor arrangement 2 comprises a communication unit 30 configured to establish a bidirectional wireless communication link with an external equipment 32, and wherein said wireless communication link is a Bluetooth link, or any other robust wireless communication link, e.g. a wireless Internet Protocol link.

Advantageously, the communication unit 30 is configured to send raw, non-processed, parameter values, e.g. current values, to said external equipment via said bidirectional wireless communication link.

As such, the sensor arrangement does not need to have embedded intelligence from an analytics point of view; it simply measures current and sends the values to an external element of the system where analysis is performed. This is advantageous because data processing circuitry is not required in the sensor arrangement, so saving energy and reducing the complexity of the circuitry.

BRIEF DESCRIPTION OF THE DRAWINGS

FIGS. 4-6 show various detail in relation to the sensor unit according to one embodiment of the present invention.

FIG. 7 is an exploded view illustrating one exemplary variation of a sensor unit according to the present invention.

DETAILED DESCRIPTION

The remote sensor arrangement will now be described in detail with references to the appended figures. Throughout the figures the same, or similar, items have the same reference signs. Moreover, the items and the figures are not necessarily to scale, emphasis instead being placed upon illustrating the principles of the invention.

Figure 1:
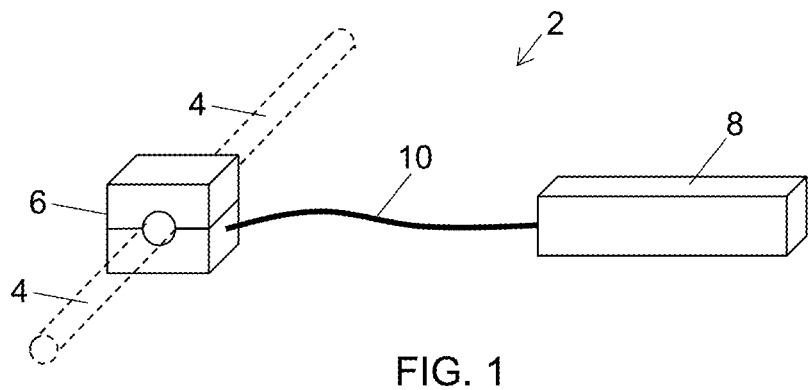
FIG. 1 shows a schematic overview illustration of the sensor arrangement according to the present invention.
Figure 2:
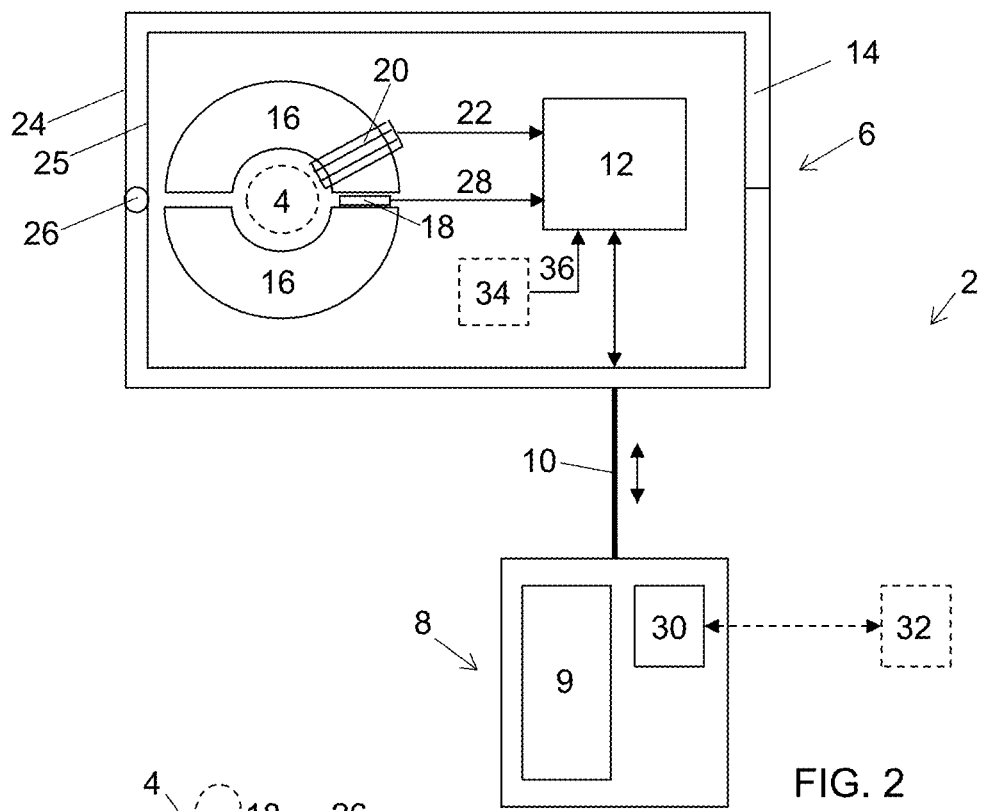
FIG. 2 is a block diagram that schematically illustrates the sensor arrangement according to the present invention.
Figure 3:
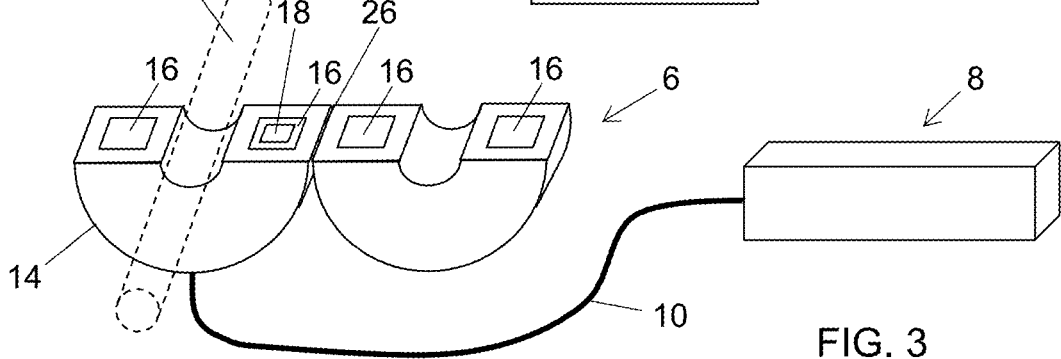
FIG. 3 is a schematic perspective view illustrating one embodiment of the sensor arrangement according to the present invention.

First with reference to the schematic illustration in FIG. 1 a stand-alone remote sensor arrangement 2 is provided for monitoring parameter activity, e.g. flowing current, in a cable 4. The arrangement comprises two separate units, a sensor unit 6 and a power source and communications unit 8 connected to each other by a connecting cable 10. With further references to FIGS. 2 and 3, the sensor arrangement also comprises a control unit 12 arranged either in the sensor unit 6 or in the power source unit 8, or distributed in both units. The power source unit 8 is configured to supply energy to the sensor unit 6 and also to its own circuitry, and comprises a battery 9 and circuitry enclosed inside a battery housing.

The sensor unit 6 comprises a shielded housing 14 enclosing a toroid-shaped core 16 configured to be fixed around the cable 4 to be monitored. The toroid-shaped core 16 is provided with at least one gap where a Hall sensor element 18 is arranged.

The remote sensor arrangement 2 is configured to be operated in a low current consumption mode and in a measurement mode. In the measurement mode the Hall sensor element 18 is configured to sense a predetermined parameter activity, e.g. flowing current, of the monitored cable 4.

The control unit 12 is configured to change the mode of operation of the sensor arrangement 2.

The sensor unit 6 further comprises a sensor activation unit 20 arranged and structured to sense parameters related to magnetic field variations in the core 16 caused by the parameter activity of the cable 4, and to generate a sensor activation signal 22 including parameter values dependent on the sensed parameters.

The control unit 12 is configured to receive the sensor activation signal 22 and to evaluate the parameter values in relation to predetermined mode changing criteria, and to change mode of operation of the sensor arrangement 2 dependent on the result of said evaluation.

According to an embodiment, one mode changing criterion relates to a derivate measure of the sensed parameters, and if the derivate measure exceeds a predetermined derivate threshold the mode of operation is changed to the measurement mode.

Preferably, the sensor activation unit 20 is a coil integrated in a printed circuit board (PCB) arranged in the housing. As an alternative, the sensor activation unit 20 is a coil that encircles a cross-sectional part of the core by being wound around the part of the core.

According to another embodiment, the toroid core 16 is divided into two semi-circular core parts, and that said Hall sensor element 18 is provided in one of the gaps between end parts of the semi-circular core parts.

In a further embodiment the housing 14 comprises at least two housing shells, an outer housing shell 24 made from a non-metallic material, and an inner housing shell 25, arranged within the outer housing shell and made from a shielding material capable of electrically and magnetically shield an inner cavity of the housing 14. The toroid core 16, the sensor activation unit 20, and the Hall sensor element 18 are arranged in the inner cavity of the housing 14.

Preferably, the housing 14 comprises two essentially equally sized parts, linked together by a hinge 26 and capable of being clamped around the cable 4, and e.g. snapped together and held in place by e.g. a plastic fastener. When the housing is mounted around the cable the housing advantageously has a shape of a cylinder having an essentially circular cross-section. Other geometrical shapes are naturally possible, e.g. the housing may have a rectangular cross section when mounted around the cable, see FIG. 1.

In a further embodiment, the sensor activation unit 20, when the arrangement is operated in the low current consumption mode, is capable of sensing current and to compare measured current values to a mode changing threshold.

In another embodiment, when the arrangement is operated in the measurement mode the sensor unit 6 is capable of performing measurement of current, being the parameter activity, in the cable 4, and to generate a measurement signal 28 comprising current values dependent on measured current.

In one other embodiment, the remote sensor arrangement 2 comprises a communication unit 30 configured to establish a bidirectional wireless communication link with an external equipment 32. The wireless communication link is a Bluetooth link, or any other wireless communication link, e.g. a Wireless Internet Protocol link.

The external equipment 32 may be arranged within a distance from the sensor arrangement 2 that secures that the chosen method, e.g. Bluetooth, of wireless communication may be achieved. The external equipment is provided with the required communication capability to establish and perform bidirectional communication to the sensor arrangement. Preferably, it should also be provided with a processing capability to perform analysis of the received measurement signal 28.

Preferably, the communication unit 30 is configured to send raw, non-processed, parameter values, e.g. current values, to the external equipment via the bidirectional wireless communication link. Thus, no processing circuitry is required in the sensor arrangement, instead, further signal processing is performed externally, e.g. in the external equipment. The further signal processing may relate to e.g. calculating the RMS, Max, Min, Mean and switching time based upon the current flowing through the cable during the switching period.

In a further embodiment the sensor unit 6 comprises a temperature sensor 34 configured to sense a temperature in relation to said sensor unit 6, and to generate a temperature signal to be applied to the control unit 12.

According to one embodiment the control unit 12 is configured to receive an externally generated mode changing signal including a mode changing command, and to change operation mode of the sensor arrangement in dependence of the mode changing command. The mode changing command may then be generated at predetermined time intervals, which e.g. is applicable for measurements in relation to track circuits.

Preferably, the control unit 12 is configured to activate the measurement mode for a predetermined time period, e.g. in the range of 0.5-2.0 seconds, and wherein during that time period the mean current is measured.

The remote sensor arrangement 2 may be used for monitoring current in cables in many different applications where remote monitoring is required, e.g. in remote places or in onerous conditions. Particularly, as mentioned above, the arrangement is structured to monitor cables applied in railway applications, e.g. for supplying power to point machines and track circuits.

The power source unit 8 comprises the power source, e.g. a battery, arranged within a power source unit housing. In one exemplary variant the following prerequisites are to be fulfilled by the power source unit. The battery life-time shall be at least 7 years at 15 degrees centigrade when applied with a sensor unit that performs and communicates measurements every two minutes. The type of battery has preferably the following operational data: 3.6V, size C, and 8.5 Ah. The power source unit housing shall not have any metal parts and is preferably made from a plastic material. Preferably, the communication unit 30, arranged within the power source unit 8, is a Bluetooth module.

The mechanical concept design of the sensor unit 6 is advantageously made with the following prerequisites and input. The physical outer housing shell does not include any metal parts on the exterior. The sensor unit 6 is structured to measure the current in a cable with a diameter of 2 mm to 4 mm without modifying the cable integrity and properties. Thus, it is not necessary to cut or remove any cables to install a sensor unit, and the installation shall not require any special tools. The measurements performed by the sensor unit are not affected by or affect other objects or nearby systems. This is secured by the shielding inner housing shell 25.

The electronics, e.g. the control unit 12, of the sensor unit 6 will advantageously be arranged on a printed circuit board (PCB) within the housing. A PCB is illustrated in the examples shown in FIGS. 5-7.

As discussed above, the current is measured with a Hall sensor element, allowing measurement of both AC and DC. The signal from the Hall-sensor is low pass filtered to remove any high frequency content before it is fed to a 16-bit AD converter and then applied to the control unit. Several different types of Hall sensor elements may be applied. Calculations on the needed sensitivity have been carried out, and these calculations together with practical tests have given a desired sensitivity of the Hall sensor element in the range of 50-100 mV/MT.

Generally, a Hall sensor is a device that is used to measure the magnitude of a magnetic field. Its output voltage is directly proportional to the magnetic field strength through it, and is used e.g. for current sensing applications.

According to one embodiment, a temperature sensor 34 is located close to the Hall sensor element, e.g. arranged at the PCB, to be able to monitor the temperature. It will then be possible to compensate the sensitivity of the system for different temperatures.

Preferably, the wake-up function is performed by the sensor activation unit that e.g. consists of a coil and signal processing electronics. The coil senses any transient current (di/dt) in the cable. This signal will be amplified, band pass filtered and used to generate an interrupt that wakens the system. It is important that the total wake-up time is short as it will not be possible to collect any data during this time. A pulse stretcher part makes a very short transient pulse longer making sure that the interrupt input of the processor can catch it.

The current consumption of the wake-up function needs to be very low as this part remains continuously active. It is specified to be below 50 µA.

Two different embodiments of the sensor activation unit are applied. The coil may either be a conventional wire wound or made on a PCB. The PCB solution is most cost efficient when also the sensor and electronic components are located on the same PCB.

In one variation a toroid core is applied with the dimensions 22/14/13 mm, that is cut in two equally sized halves. With regard to the core material specification, the parameter coercive force is important to get as low hysteresis as possible. It should be as low as possible and not have a non-linear variation with temperature. Another important parameter is the permeability, which should have a linear behaviour over the temperature range.

The conclusion from above tests is that the geometry of the core is important when it comes to reducing impact from external magnetic fields and a toroid core is therefore preferred.

The toroid should not have a bigger diameter than necessary as this makes it more sensitive to external magnetic fields. The minimum diameter is set by the outer diameter of monitored cables plus some mechanical restrictions. It also shows that a bigger length of the toroid is better when it comes to suppressing external magnetic fields.

The desired air-gap is in the range of 2-4 mm in total.

With regard to materials for the toroid core several different ferrite materials may be considered. The parameter coercive force is important, to get as low hysteresis as possible. Another important parameter is the permeability, to have a linear behaviour over the temperature range.

Thus, the complete current sensor unit comprises a core (concentrator), a Hall sensor element and a sensor activation unit, e.g. a coil. The core concentrates and amplifies the induced field from the cable to be monitored. In an air-gap the Hall-sensor element is mounted. This sensor senses both AC and DC current. The sensor activation unit is only sensing changes in the current and is used for waking up the whole arrangement, when performing Event Initiated Measurement (EIM).

The sensor unit works according to an open loop principle. The reason for this is cost and complexity. A closed loop sensor will consume additional energy as this is an active system with current feedback. The complexity will cost more in both components count and develop time. Thus, the object is to be able to monitor measurements that relate both to type 1 (tracking circuit=1 A) and type 2 (point machine=10 A) by the same sensor unit.

In one embodiment of the sensor activation unit, a wake-up coil is provided with 200 turns that may detect a transient current of 200 mA. The sensitivity can easily be adjusted by the number of windings on the coil or in the gain of the amplifier. As this coil is only sensitive to AC there is no DC offset which means that it is possible to work with high gain without the risk for saturation of the amplifier.

The size of the air-gap where the Hall sensor is arranged only marginally affects the sensitivity of the coil. The core material has a much bigger influence of the sensitivity. The coil senses any transient current (di/dt) in the cable. The sensor activation signal 22 is applied to the control unit 12 where it will be amplified, filtered and used to generate an interrupt that wakens the system. It is important that the total wake-up time is minimal as it will not be possible to collect any data during this time. It is estimated that the start-up time for the processor in the control unit will be below 2 ms and it is important that the major part of this is not coming from the sensor.

A calculation on the noise margin of the coil and amplifier together shows that the amplifier will set the noise level but it will not be critical. As an example, an operational amplifier with a noise level in the area of 20 nV/sqr Hz may be used.

As mentioned above, there are different solutions regarding how to realize the coil. The coil may either be a conventional coil or made on one or several PCBs. The PCB solution may be more cost efficient because also the Hall sensor may be arranged at the same PCB.

The sensor unit includes a magnetic shielding which is provided by the inner housing shell 25. This may be achieved in several ways. The whole core can be shielded or just partly shielded, or a tubular shield. The Hall sensor element is itself sensitive to an external field and should also be shielded. The shielding material may be mild steel or mu-metal. In one variation mild steel is applied and the thickness is around 0.3 mm. The shielding needs to be efficient from DC to some tenths of kHz. The material must not be saturated. The shielding inner housing shell 25 is arranged at a predetermined distance from the core, e.g. more than 5 mm, so that the shield does not have a magnetic coupling to the core, otherwise this will negatively affect the hysteresis of the core. The different shields do not need to be in electric contact with each other but they need to overlap.

Generally, the sensor unit 6 itself needs to be rigidly mounted and immobile. If the sensor unit can move it will cause an error in the sensors offset due to the geomagnetic field. The cable 4 should be tightly clamped in the concentrator through-going opening defined by the toroid core 16. This may be achieved by flexible pads structured to centre the cable in the opening. If the cable has the possibility to move this has a potential for error in the measurement.

In one exemplary version of the sensor unit 6 the core snaps down in the shielding inner housing shell 25 where it is fixed by ribs and snaps, see FIG. 4. To manage the ferrite core tolerances a foam spacer might be necessary to place under the core so the necessary air gap is fulfilled. The connecting cable 10 is then connected to the PBA. In this exemplary version the PCB includes a built in coil with several turns that extends around the core, for the wake-up function. The PBA also includes analogue components, a rigid flex with the hall sensor element, a temperature sensor and a cable connector. As shown in FIG. 5 the PBA is provided with two openings located at positions and having dimensions that enables the PBA to be mounted such that the core will extend through the openings. This is advantageous in that the Hall sensor may be positioned in the gap between the two core parts by means of the rigid flex and also that the circuitry at the PCB will be shielded by the inner housing shell.

The PBA is then snapped down in inner housing shell and the sensor flex are mounted on the core with adhesive, see FIG. 6.

An exploded view of the entire sensor unit 6 is shown in FIG. 7. In FIG. 7 is shown the essential parts previously discussed, and in addition further details required to mount the various parts together and also flexible paddings used to firmly hold the cable to be monitored in a fixed position. Specifically, the air gap where the Hall sensor element is to be mounted between the core-core is critical, and therefore, in order to secure a predetermined gap distance a spring might be required to push the core down against one or many spacers.

The dimensions of the above disclosed exemplary sensor unit is 40*40*30 mm (40*45*30 with snap and living hinge included). The size depends e.g. on size and amount of component that need to be on the PCB, and the space for the built in coil on the PCB.

According to one variation of the connecting cable 10, it has a diameter of 3.3 mm and is typically at least 700 mm long. Other lengths and dimensions are naturally possible. The cable shall be shielded. On the cable there shall be a cable gland on each side, for strain relief and sealing.

The main application is measuring driving electrical power to point machines and track circuits. There are numerous further applications and industries where the remote sensor arrangement may be used. Its purpose is long term predictive analysis as it senses a trend in current drawn. For example, when used with a point machine, the sensor unit of the remote sensor arrangement is clamped around the power supply cable to the point machine. The sensor activation unit senses that the point machine is activated by sensing the voltage induced in the sensor unit when there is current in the cable, then the main measurement is triggered. The sensor arrangement does not send any alarms but generates and wirelessly transmits the raw measurement signal to an external element of the system where the gathered data is analysed and may be acted upon. For a point machine the RMS, Max, Min, Mean and switching time is calculated based on the current flowing through the clamp during the switching period.

Track circuits are measured at configurable time intervals, they are not activated by any current induced event, i.e. the sensor doesn't know if there's a train occupying the track. For track circuits only the mean current is measured for approximately 1 second; this value is later used for long-term predictive analysis purposes.

For water pumps protecting signalling equipment rooms, the remote sensor arrangement provides low-cost power supply monitoring similar to the examples above.

The measurement of the predetermined parameter activity in the cable performed by the sensor unit may be initiated in two different ways. Either an Event Initiated Measurement (EIM), or a Time Initiated Measurement (TSIM).

The EIM measurement is started when the sensor activation unit, e.g. the coil, in the sensor unit senses transient activity, e.g. from increased current, in the cable. The activation unit then produces a short pulse that is used to wake up the sensor unit.

The current off/on event creates a detectable slope (positive and/or negative as needed) which is used to wake up the sensor from sleep. The sensor samples windows of n samples and calculates the RMS value. When z consecutive window RMS values are larger than a predetermined start_threshold, the waveform will be saved. The sampling is ended when z consecutive windows are lower than a predetermined stop_threshold.

The parameters n, start_threshold, stop_threshold and z are configurable.

The TSIM measurement is done on timed intervals specified in the device configuration.

When the sensor wakes up for a measurement it sample n samples with a separation of t (ms). To save battery the sensor will sleep between the n samples.

The parameters n, t and variance_threshold are configurable.

The present invention is not limited to the above-described preferred embodiments. Various alternatives, modifications and equivalents may be used. Therefore, the above embodiments should not be taken as limiting the scope of the invention, which is defined by the appending claims.

The invention claimed is:

1. A stand-alone remote sensor arrangement for monitoring parameter activity in a cable, the arrangement comprising:
   a sensor unit and a power source unit connected to each other by a connecting cable, and
   a control unit,
   wherein the power source unit is configured to supply energy to said sensor unit,
   wherein the sensor unit comprises a shielded housing enclosing a toroid-shaped core configured to be fixed around the cable to be monitored,
   wherein the toroid-shaped core is provided with at least one gap where a Hall sensor element is arranged,
   wherein the remote sensor arrangement is configured to be operated in a low current consumption mode and in a measurement mode, in which measurement mode said Hall sensor element is configured to sense a predetermined parameter activity, of said cable, and
   wherein said control unit is configured to change the mode of operation of said sensor arrangement, and
   wherein the sensor unit further comprises a sensor activation unit arranged and structured to sense parameters related to magnetic field variations in said core caused by said parameter activity of said cable, and to generate a sensor activation signal including parameter values dependent on said sensed parameters, and wherein the control unit is configured to receive said sensor activation signal and to evaluate said parameter values in relation to predetermined mode changing criteria, and to change mode of operation of said sensor arrangement dependent on the result of said evaluation.

2. The remote sensor arrangement according to claim 1, wherein one mode changing criterion relates a derivate measure of said sensed parameters, and if the derivate measure exceeds a predetermined derivate threshold the mode of operation is changed to the measurement mode.

3. The remote sensor arrangement according to claim 1, wherein said sensor activation unit is a coil integrated in a printed circuit board arranged in said housing.

4. The remote sensor arrangement according to claim 1, wherein said sensor activation unit is a coil that encircles a cross-sectional part of said core by being wound around said part of the core.

5. The remote sensor arrangement according to claim 1, wherein the toroid core is divided into two semi-circular core parts, and that said Hall sensor element is provided in one of said gaps between end parts of said semi-circular core parts.

6. The remote sensor arrangement according to claim 1, wherein said housing comprises at least two housing shells, an outer housing shell made from a non-metallic material, and an inner housing shell , arranged within said outer housing shell and made from a shielding material capable of electrically and magnetically shield an inner cavity of said housing where said toroid core , said sensor activation unit , and said Hall sensor element are arranged.

7. The remote sensor arrangement according to claim 1, wherein said housing comprises two essentially equally sized parts, linked together by a hinge and capable of being clamped around said cable , and wherein when mounted around said cable said housing has a shape of a cylinder having an essentially circular cross-section.

8. The remote sensor arrangement according to claim 1, wherein when in said low current consumption mode the sensor activation unit is capable of sensing current and to compare measured current values to a mode changing threshold.

9. The remote sensor arrangement according to claim 1, wherein when in said measurement mode the sensor unit is capable of performing measurement of current, being said parameter activity, in said cable, and to generate a measurement signal comprising current values in dependence of measured current.

10. The remote sensor arrangement according to claim 1, comprising a communication unit configured to establish a bidirectional wireless communication link with an external equipment , and wherein said wireless communication link is a Bluetooth link, or any other wireless communication link.

11. The remote sensor arrangement according to claim 10, wherein said communication unit is configured to send raw, non-processed, parameter values to said external equipment via said bidirectional wireless communication link.

12. The remote sensor arrangement according to claim 1, wherein said sensor unit comprises a temperature sensor configured to sense a temperature in relation to said sensor unit , and to generate a temperature signal to be applied to said control unit .

13. The remote sensor arrangement according to claim 1, wherein the control unit is configured to receive an externally generated mode changing signal including a mode changing command, and to change operation mode of the sensor arrangement dependent on the mode changing command.

14. The remote sensor arrangement according to claim 1, wherein said control unit is configured to activate said measurement mode for a predetermined time period and wherein during said time period the mean current is measured.

15. The remote sensor arrangement according to claim 1, wherein said arrangement is structured to monitor cables applied in railway implementations.

* * * * *